United States Patent
Biber et al.

(10) Patent No.: US 8,244,328 B2
(45) Date of Patent: Aug. 14, 2012

(54) HEAD COIL FOR A MAGNETIC RESONANCE DEVICE

(75) Inventors: Stephan Biber, Frauenaurach (DE); Daniel Driemel, Öderan (DE); Helmut Greim, Adelsdorf (DE); Karsten Jahns, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 335 days.

(21) Appl. No.: 12/597,947

(22) PCT Filed: Oct. 31, 2008

(86) PCT No.: PCT/EP2008/064781
§ 371 (c)(1),
(2), (4) Date: Oct. 28, 2009

(87) PCT Pub. No.: WO2009/056622
PCT Pub. Date: May 7, 2009

(65) Prior Publication Data
US 2010/0121180 A1    May 13, 2010

(30) Foreign Application Priority Data

Nov. 2, 2007 (DE) .......... 10 2007 052 446

(51) Int. Cl.
*A61B 5/00* (2006.01)
(52) U.S. Cl. ........ 600/421; 600/422; 600/410; 324/318; 324/307
(58) Field of Classification Search .............. 600/410, 600/421, 422; 324/307, 318, 322
See application file for complete search history.

(56) References Cited

U.S. PATENT DOCUMENTS

| | | | |
|---|---|---|---|
| 5,682,098 A * | 10/1997 | Vij | 324/318 |
| 5,951,474 A * | 9/1999 | Matsunaga et al. | 600/422 |
| 6,344,745 B1 | 2/2002 | Reisker et al. | |
| 6,441,612 B1 * | 8/2002 | Shimo et al. | 324/309 |
| 6,577,888 B1 * | 6/2003 | Chan et al. | 600/422 |
| 6,693,427 B2 | 2/2004 | Drobnitzky | |
| 6,795,037 B2 | 9/2004 | Greim | |
| 6,930,480 B1 | 8/2005 | Fujita et al. | |
| 7,012,430 B2 * | 3/2006 | Misic | 324/318 |
| 7,408,351 B2 * | 8/2008 | Yoshida | 324/318 |
| 7,474,098 B2 * | 1/2009 | King | 324/318 |
| 7,701,209 B1 * | 4/2010 | Green | 324/307 |
| 7,746,073 B2 * | 6/2010 | Cho et al. | 324/318 |

(Continued)

FOREIGN PATENT DOCUMENTS
DE    195 05 062 A1    10/1996
(Continued)

OTHER PUBLICATIONS

"A QD 4-Channel Array Coil for fMRI and Brain Imaging," Hamamura et al., Proc. Intl. Soc. Magn. Reson. Med., vol. 7 (1999), p. 738.

*Primary Examiner* — Brian Casler
*Assistant Examiner* — Amanda Lauritzen
(74) *Attorney, Agent, or Firm* — Schiff Hardin LLP

(57) ABSTRACT

A head coil for a magnetic resonance apparatus has a supporting body that carries a number of antenna elements. The supporting body has an end section that is shaped as a spherical cap. A butterfly antenna is mounted at the end section, and is annularly surrounded by at least one group antenna that overlaps the butterfly antenna.

18 Claims, 2 Drawing Sheets

U.S. PATENT DOCUMENTS

| | | | |
|---|---|---|---|
| 7,877,129 B2* | 1/2011 | Takahashi et al. | 600/410 |
| 7,970,452 B2* | 6/2011 | Piron et al. | 600/411 |
| 8,046,046 B2* | 10/2011 | Chan et al. | 600/422 |
| 2004/0066195 A1 | 4/2004 | Reykowski | |
| 2005/0107686 A1 | 5/2005 | Chan et al. | |
| 2008/0097192 A1 | 4/2008 | Driemel | |
| 2009/0099444 A1* | 4/2009 | Bogdanov | 600/422 |
| 2011/0226260 A1* | 9/2011 | Eder et al. | 128/845 |
| 2011/0260728 A1* | 10/2011 | Biber et al. | 324/318 |

FOREIGN PATENT DOCUMENTS

| | | |
|---|---|---|
| WO | WO 2005/109010 A2 | 11/2005 |
| WO | WO 2005/120340 A2 | 12/2005 |

\* cited by examiner

HEAD COIL FOR A MAGNETIC RESONANCE DEVICE

BACKGROUND OF THE INVENTION

1. Field of the Invention

The invention concerns a head coil provided as a radio-frequency antenna for a magnetic resonance apparatus, the head coil being configured to be arranged around the head of a patient to be examined with a magnetic resonance apparatus.

2. Description of the Prior Art

A head coil (also known as a head array antenna) for a magnetic resonance tomography apparatus is known from DE 195 05 062 A1, for example. An arrangement of sub-antennas is located on the generated surface of a support body of the known head coil, wherein the generated surface can represent an inner or outer surface of a hollow cylindrical segment. The known head coil furthermore has an end segment that can be fashioned as a spherical cap, such that the head array antenna approximates a helmet in its shape. Just as on the generated surface, butterfly antennas can be arranged on the end segment. Individual sub-antennas on the generated surface are formed by a loop antenna and a butterfly antenna. In contrast to this, an auxiliary antenna arranged on the end segment is formed as a circularly polarized antenna made up of two butterfly antennas arranged crossed relative to one another. The imaging region should be homogenized via a partial, mutual overlapping of the butterfly antennas.

SUMMARY OF THE INVENTION

An object of the present invention is to provide a head coil that is suitable for magnetic resonance tomography that has both a good adaptation to the anatomy of the human head and advantageous electrical properties, in particular with regard to the achievable signal-to-noise ratio.

This object according to the invention is achieved according to the invention by a head coil having a support body carrying a number of antenna elements, the support body having an end segment fashioned as a spherical cap on which a butterfly antenna is arranged. The butterfly antenna is annularly surrounded by a plurality of loop antennas arranged overlapping with this.

As used herein, the shape of a spherical cap is not only a shape that is identical in the strictest geometric sense to a segment of a spherical surface, but also encompasses spherical cap-like geometries that are adapted at least approximately to the calvarium of a patient to be examined with a magnetic resonance apparatus.

In an embodiment that affords a particularly simple, patient-friendly handling, the support body of the head coil is composed of a lower shell and an upper shell. At the same time, an inductive geometric decoupling can be achieved in that an antenna element arranged on the upper shell overlaps with an antenna element arranged on the lower shell.

Independent of whether the support body is designed as one shell or multiple shells (in particular two shells), advantageous physical properties resulting in particular in a good signal-to-noise ratio can be achieved in that two respective adjacent loop antennas which as a whole annularly surround the butterfly antenna overlap.

Surprisingly, it has been shown that the arrangement of only a single butterfly antenna in the region of the end segment (i.e. in the region of the spherical cap of the head coil) is particularly advantageous.

According to a preferred embodiment, a cylindrical support segment connects to the end segment of the support body that is fashioned as a spherical cap. The cylindrical support segment of the head coil is thus facing towards the neck and the body of the patient. In a further embodiment, the support body has two eye openings, in particular in the region of the cylindrical support segment. The patient can thus look out from the support body through the eye openings. It is therefore possible to expose the patient to specific visual stimuli during a magnetic resonance examination and to detect activity of the brain stimulated by these stimuli. Each eye opening is advantageously completely surrounded by at least one antenna element. At the same time, in a preferred geometry design of the head coil a nose cutout is fashioned in the support body between the eye openings. The individual antenna elements in the region of the view of the patient can therefore be positioned near to the skull.

The butterfly antenna advantageously has the following geometric features, which can be realized individually or in different combinations:

Electrical conductors (in particular conductor traces) of the butterfly antenna describe two arc segments fashioned so as to be mirror-symmetrical to one another. These are preferably arranged (at least in one projection) on the circumference of one and the same circle. Conductor segments of lesser curvature (advantageously uncurved linear segments of the butterfly antenna) connect to the ends of the arc segments. In the projection view, the linear segments describe an intersection point that coincides with the center point of the circle described by the arc segments. An angle of at least 15° (preferably between 30° and 60° and most preferably 45°) is enclosed between the intersecting linear segments.

The advantage of the invention in particular lies in that a head coil provided for magnetic resonance tomography and acting as a radio-frequency antenna is adapted well to the anatomy of the human head so that the individual antenna elements are only slightly distanced from the head. An end piece of the head coil that covers the calvarium of the patient, in which end piece are integrated a central butterfly antenna as well as multiple loop antennas annularly surrounding said butterfly antenna overall, provides a significant contribution to a high spatial resolution and an advantageous signal-to-noise ratio, wherein every loop antenna forms overlaps both with two adjacent loop antennas in the circumferential direction and with the central butterfly antenna.

DESCRIPTION OF THE PREFERRED EMBODIMENTS

Figure 1:
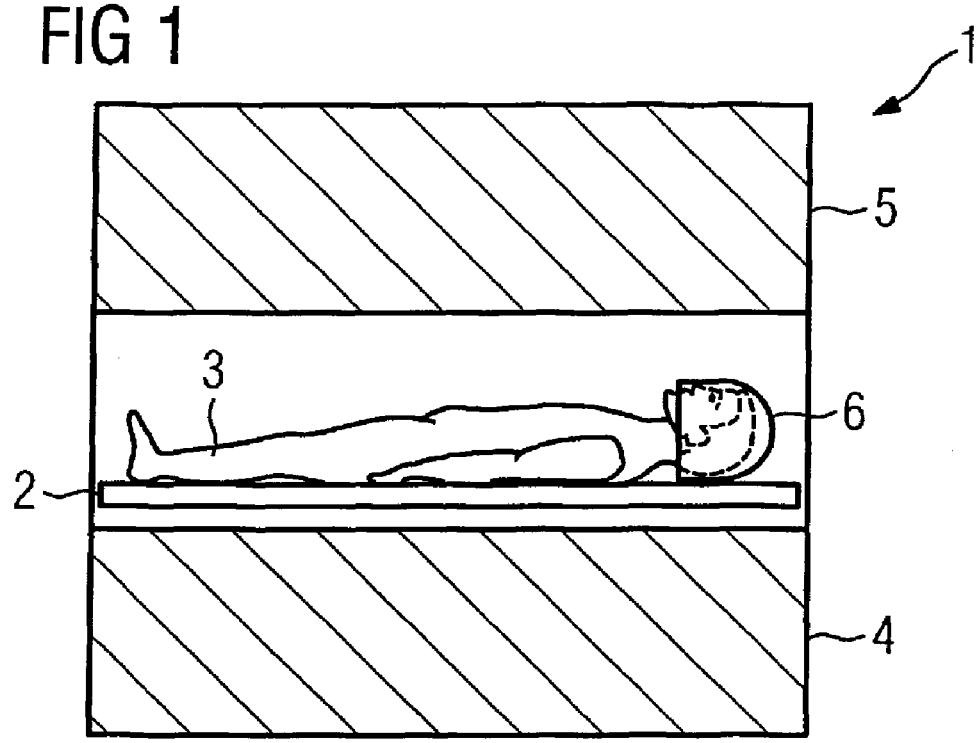
FIG. 1 schematically illustrates a magnetic resonance tomography apparatus with a head coil employed as a local coil.

FIG. 1 shows in a rough schematic a magnetic resonance tomography apparatus 1; reference with regard to its basic function is made by way of example to DE 102 11 567 C1. A patient 3 positioned on a patient bed 2 is examined with the magnetic resonance tomography apparatus 1.

Electromagnets arranged in housing parts 4, 5 of the magnetic resonance tomography apparatus 1, namely a basic magnet provided to generate a homogeneous basic magnetic field and a gradient magnet system, are not shown in FIG. 1.

In contrast to this, a head coil 6 acting as a high channel coil is recognizable in longitudinal section in FIG. 1, in which head coil 6 the head of the patient 3 is located. Details of the head coil 6 are described in the following using FIGS. 2 through 4.

Figure 2:
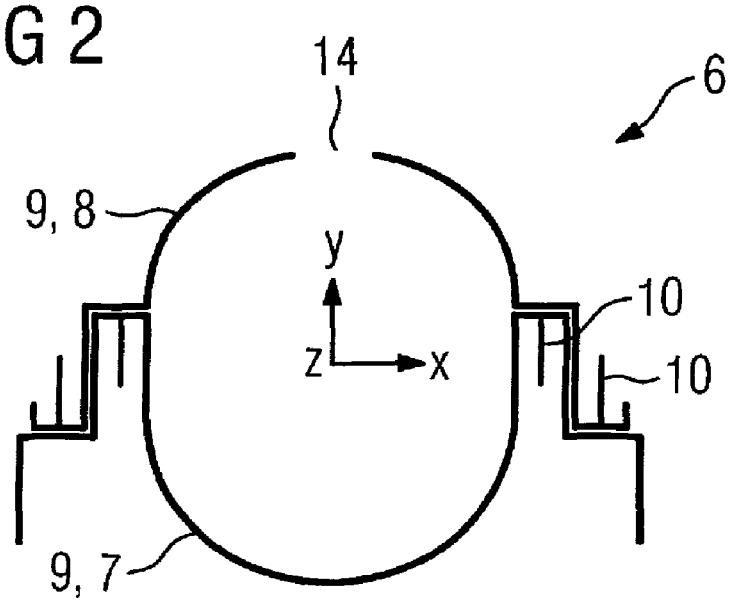
FIG. 2 shows the head coil in accordance with the invention, of the magnetic resonance tomography apparatus of FIG. 1, in cross-section.

A coordinate system with axes x, y, z is drawn in FIG. 2, which shows a cross section through the head coil 6. As can be seen from FIG. 2, the head coil 6 is composed of two half-shells 7, 8, namely of a lower shell 7 arranged on the patient bed 2 and an upper shell 8 connected with said lower shell 7 such that it can be detached. Lower shell 7 and upper shell 8 together form a support body 9 of the head coil 6, wherein the lower shell 7 overlaps with the upper shell 8.

Antenna elements 10 which likewise overlap in the region of the overlap between the lower shell 7 and the upper shell 8 are located both on said lower shell 7 and said upper shell 8. In order to clarify the overlap between the antenna elements 10, a representation that is in particular distorted in the x-direction is selected in FIG. 2. An inductive overlap is formed that electrically decouples the antenna elements 10 situated next to one another on the different half-shells 7, 8 in a manner that enables the acquisition of image data with a high resolution. The fact that no electrical connections exist between the lower shell 7 and the upper shell 8 to decouple the antenna elements 10 arranged on the different half-shells 7, 8 is particularly advantageous.

The section shown in FIG. 2 shows an essentially cylindrical segment of the support body 9 that is designated as a support segment 11. The term "support segment" does not imply any attribute as to the static function of this segment of the support body 9 in comparison to other parts of the support body 9. As is recognizable in FIGS. 1 and 3, an end segment 12 of the support body 9 that is fashioned as a spherical cap attaches to the support segment 11 facing towards the body of the patient 3. Like the support segment 11, the end segment 12 is formed partially from the lower shell 7 and partially from the upper shell 8.

Figure 3:
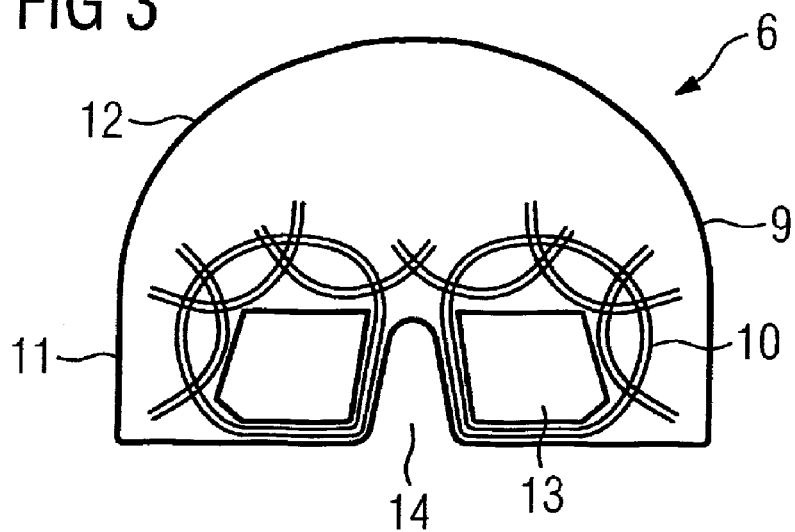
FIG. 3 is a plan view of the head coil of FIG. 2.

Only a few antenna elements 10 are shown in FIG. 3, primarily in the region of the support segment 11. Located in this segment are two eye openings 13 and a nose cutout 14 in the upper shell 8. The eye openings 13 on the one hand have the purpose of enabling the patient to look out from the head coil 6; on the other hand, thanks to the eye openings 13 it is also possible to expose the patient to targeted optical stimuli, as is principally known from DE 101 18 472 C1, for example. The eye openings 13 according to the exemplary embodiment shown in FIG. 3 are respectively completely surrounded by antenna elements 10. The nose cutout 14 ensures that these antenna elements 10 can be arranged particularly close to the face of the patient 3.

Figure 4:
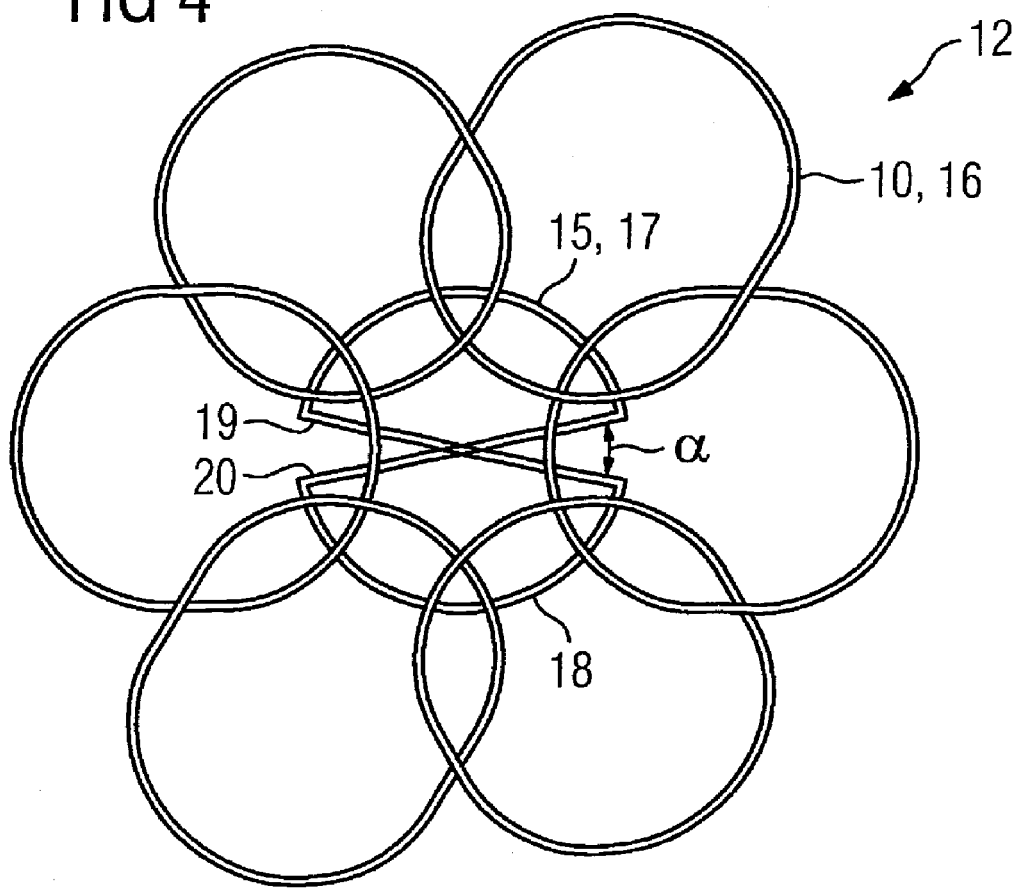
FIG. 4 illustrates the antenna arrangement of the head coil of FIGS. 2 and 3.

Details of the end segment 12 can be recognized in FIG. 4, which shows a projection in the z-direction. A central antenna element of the essentially spherically curved end segment 12 (which is well adapted to the shape of the calvarium of the patient 3) is a butterfly antenna 15 that is overall annularly surrounded by (in the exemplary embodiment six) loop antennas 16. Contours of the half-shells 7, 8 are not shown in FIG. 4 for clarity.

Each of the annular loop antennas 16 overlaps both with the two at least approximately similar loop antennas 16 that are adjacent in the circumferential direction and with the butterfly antenna 15.

The butterfly antenna 15 has the basic shape of a circle and has two arc segments 17, 18 that are fashioned so as to be mirror-symmetrical to one another, which arc segments 17, 18 are arranged on the circumference of one and the same circle. Linear segments 19, 20 adjoin the ends of the arc segments 17, 18, which linear segments 19, 20 form an X in the shown projection and enclose an angle α of less than 45° between them. The antenna geometry according to FIG. 4 enables information to be acquired with a good signal-to-noise ratio (signal-to-noise), even in a region of the end segment 12 which is arranged essentially orthogonal to the z-axis.

Although modifications and changes may be suggested by those skilled in the art, it is the intention of the inventors to embody within the patent warranted heron all changes and modifications as reasonably and properly come within the scope of their contribution to the art.

The invention claimed is:

1. A head coil for a magnetic resonance apparatus comprising:
 a supporting body;
 a plurality of antenna elements supported on said supporting body, said antenna elements forming a butterfly antenna and said support body comprising an end segment formed as a spherical cap on which said butterfly antenna is mounted;
 a plurality of loop antennas carried by said supporting body, annularly surrounding said butterfly antenna and overlapping said butterfly antenna; and
 said supporting body comprising a lower shell and an upper shell, with one of said antenna elements carried at said upper shell and overlapping with another of said antenna elements carried on said lower shell.

2. A head coil as claimed in claim 1 comprising two loop antennas that each annularly surround said butterfly antenna.

3. A head coil as claimed in claim 1 wherein said end segment of said supporting body has only a single butterfly antenna mounted thereon.

4. A head coil as claimed in claim 1 comprising a cylindrical support segment connected to said end segment of said supporting body.

5. A head coil as claimed in claim 1 wherein said supporting body is configured to be worn at the head of a patient, and comprises two eye openings.

6. A head coil as claimed in claim 5 wherein each eye opening is surrounded by at least one of said antenna elements.

7. A head coil as claimed in claim 5 wherein said supporting body comprises a nose cutout between said eye openings.

8. A head coil as claimed in claim 1 wherein said butterfly antenna comprises two arc segments that are mirror-symmetrical relative to each other.

9. A head coil as claimed in claim 8 wherein said butterfly antenna comprises linear segments that are connected to respective ends of said arc segments.

10. A head coil as claimed in claim 9 wherein said linear segments enclose an angle of at least 15° therebetween.

11. A head coil as claimed in claim 9 wherein said linear segments enclose an angle of at most 60° therebetween.

12. A head coil as claimed in claim 8 wherein said arc segments are located on the circumference of the same circle.

13. A magnetic resonance tomography apparatus comprising:
 a magnetic resonance data acquisition unit configured to acquire magnetic resonance data from a patient, said magnetic resonance data acquisition unit comprising a radio-frequency system that includes a head coil;

said head coil comprising a supporting body, a plurality of antenna elements supported on said supporting body, said antenna elements forming a butterfly antenna and said supporting body comprising an end segment formed as a spherical cap on which said butterfly antenna is mounted, and a plurality of loop antennas carried by said supporting body, annularly surrounding said butterfly antenna and overlapping said butterfly antenna; and said supporting body comprising a lower shell and an upper shell, with one of said antenna elements carried at said upper shell and overlapping with another of said antenna elements carried on said lower shell.

14. A head coil for a magnetic resonance apparatus comprising:
   a supporting body;
   a plurality of antenna elements supported on said supporting body, said antenna elements forming a butterfly antenna and said support body comprising an end segment formed as a spherical cap on which said butterfly antenna is mounted;
   a plurality of loop antennas carried by said supporting body, annularly surrounding said butterfly antenna and overlapping said butterfly antenna; and
   said supporting body being configured to be worn at the head of a patient, and comprising two eye openings, with each eye opening surrounded by at least one of said antenna elements.

15. A head coil as claimed in claim 14 wherein said supporting body comprises a lower shell and an upper shell.

16. A head coil as claimed in claim 15 wherein one of said antenna elements is carried at said upper shell and overlaps with another of said antenna elements carried on said lower shell.

17. A magnetic resonance tomography apparatus comprising:
   a magnetic resonance data acquisition unit operable to acquire magnetic resonance data from a patient, said magnetic resonance data acquisition unit comprising a radio-frequency system that includes a head coil;
   said head coil comprising a supporting body, a plurality of antenna elements supported on said supporting body, said antenna elements forming a butterfly antenna and said supporting body comprising an end segment formed as a spherical cap on which said butterfly antenna is mounted, and a plurality of loop antennas carried by said supporting body, annularly surrounding said butterfly antenna and overlapping said butterfly antenna; and
   said supporting body being configured to be worn at the head of a patient, and comprising two eye openings, with each eye opening surrounded by at least one of said antenna elements.

18. A head coil for a magnetic resonance apparatus comprising:
   a supporting body comprising an end segment formed as a spherical cap, and said supporting body comprising two apertures therein;
   a plurality of antennas supported on said end segment of said supporting body, said antennas comprising a butterfly antenna and a plurality of loop antennas annularly surrounding said butterfly antenna and overlapping said butterfly antenna; and
   each of said apertures being completely surrounded by at least one of said loop antennas.

* * * * *